(12) United States Patent
Yamamoto et al.

(10) Patent No.: US 9,385,155 B2
(45) Date of Patent: Jul. 5, 2016

(54) PHOTODIODE ARRAY

(71) Applicant: HAMAMATSU PHOTONICS K.K., Hamamatsu-shi, Shizuoka (JP)

(72) Inventors: Koei Yamamoto, Hamamatsu (JP); Terumasa Nagano, Hamamatsu (JP); Kazuhisa Yamamura, Hamamatsu (JP); Kenichi Sato, Hamammatsu (JP); Ryutaro Tsuchiya, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/314,616

(22) Filed: Jun. 25, 2014

(65) Prior Publication Data

US 2014/0306314 A1    Oct. 16, 2014

Related U.S. Application Data

(63) Continuation of application No. 13/655,907, filed on Oct. 19, 2012, now Pat. No. 8,791,538.

(30) Foreign Application Priority Data

Oct. 18, 2012    (JP) .................. 2012-230921

(51) Int. Cl.
H01L 31/00    (2006.01)
H01L 27/146    (2006.01)
H01L 27/144    (2006.01)

(52) U.S. Cl.
CPC ...... *H01L 27/14643* (2013.01); *H01L 27/1443* (2013.01); *H01L 27/1446* (2013.01); *H01L 27/14605* (2013.01)

(58) Field of Classification Search
CPC ................ H01L 27/14; H01L 27/1446; H01L 27/14603; H01L 31/107
USPC .......... 257/291, 438, 443, 448, 461, E27.129, 257/E27.132, E27.133, E31.116
See application file for complete search history.

(56) References Cited

U.S. PATENT DOCUMENTS

| 6,936,904 B2 * | 8/2005 | Toyoda et al. ................. 257/431 |
| 7,719,029 B2 * | 5/2010 | Itzler ............................. 257/186 |
| 8,008,741 B2 | 8/2011 | Yamamura et al. |
| 2004/0061193 A1 | 4/2004 | Toyoda et al. |
| 2009/0121306 A1 | 5/2009 | Ishikawa |
| 2009/0256223 A1 | 10/2009 | Yamamura et al. |
| 2013/0093054 A1 * | 4/2013 | Lee ............................... 257/536 |

FOREIGN PATENT DOCUMENTS

| CN | 101379615 | 3/2009 |
| CN | 101432893 | 5/2009 |
| CN | 101484999 | 7/2009 |
| EP | 1 755 171 | 2/2007 |
| JP | 2011-003740 | 1/2011 |
| JP | 2012-099580 | 5/2012 |

* cited by examiner

*Primary Examiner* — Hung Vu
(74) *Attorney, Agent, or Firm* — Drinker Biddle & Reath LLP

(57) ABSTRACT

A light receiving region includes a plurality of light detecting sections 10. The light detecting sections 10 has a second contact electrode 4A. The second contact electrode 4A is arranged at a position overlapping a first contact electrode 3A, so as to contact the first contact electrode. Further, a resistive layer 4B is continued to the second contact electrode 4A.

4 Claims, 14 Drawing Sheets

50μm INTERVAL

20μm INTERVAL

15μm INTERVAL

10μm INTERVAL

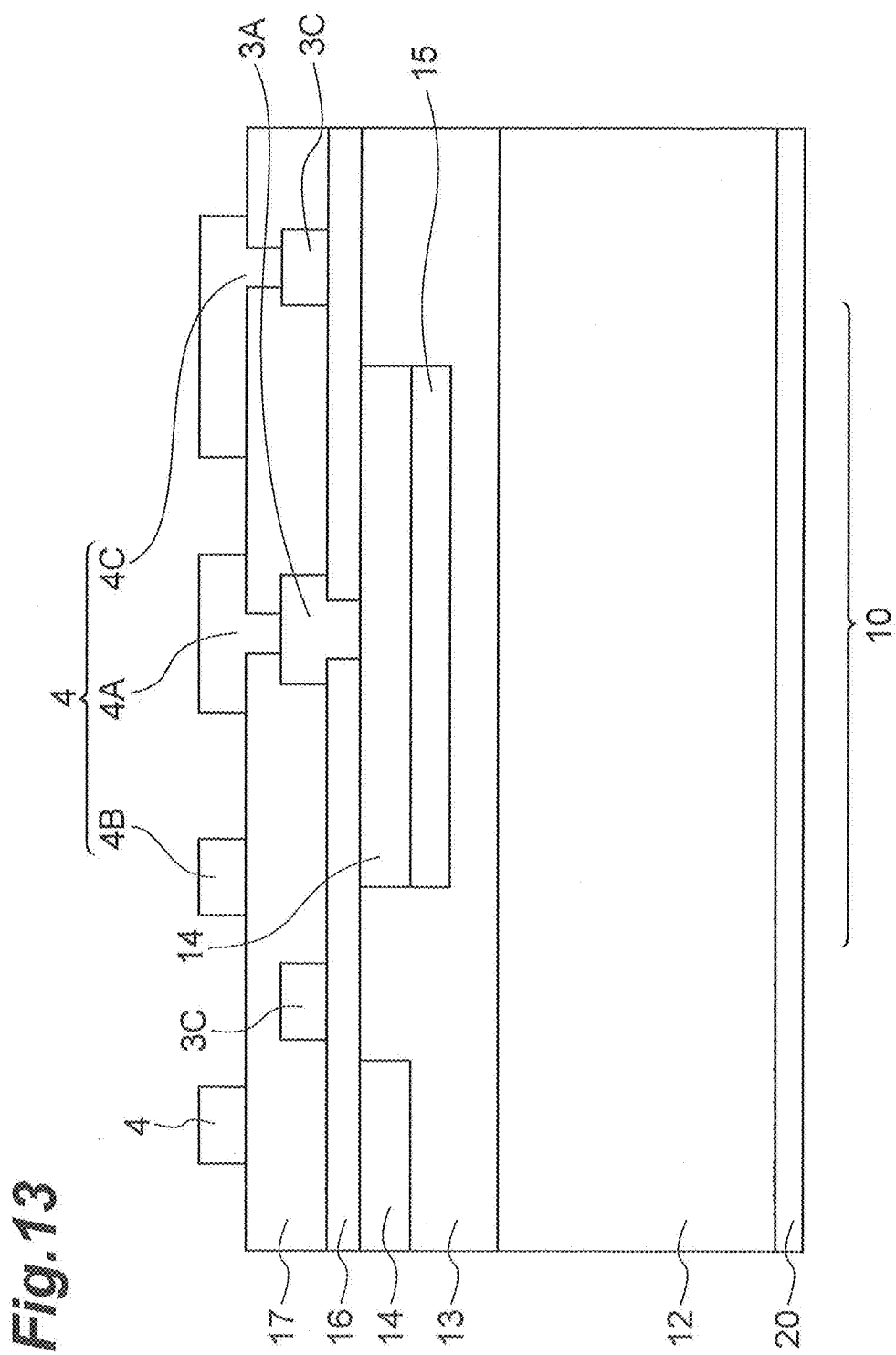

PHOTODIODE ARRAY

This is a continuation application of copending prior application Ser. No. 13/655,907, filed on Oct. 19, 2012, which is incorporated by reference herein in its entirety.

TECHNICAL FIELD

An aspect of the present invention relates to a photodiode array.

BACKGROUND

A conventional photodiode array is described in, for example, the following Patent Document 1. A photodiode array such as an SiPM (Silicon Photo Multiplier) or a PPD (Pixelated Photon Detector) has a configuration in which APDs (avalanche photodiodes) are arrayed in a matrix state, and the plurality of APDs are connected in parallel, to read out a sum of APD outputs. When the APDs are operated in the Geiger mode, it is possible to detect feeble light (photons). That is, in the case where photons are made incident to an APD, carriers generated inside the APD are output to the outside via a quenching resistor and a wiring pattern for signal readout. Although an electric current flows in the pixels in which an avalanche effect occurs in the APD, a voltage drop occurs in the quenching resistor of approximately several hundreds of kΩ, which is directly connected to the pixels. Due to this voltage drop, a voltage applied to the amplified region of the APD lowers, and the multiplication action due to the avalanche effect is terminated. In this way, one pulse signal is output from an APD by incidence of one photon. Conventionally, a first contact electrode is provided in one of the semiconductor layers composing a p-n junction, and a resistive layer is connected to the wiring in the same plane of the wiring continued to the first contact electrode.

[Patent Document 1] European Patent Application Publication No. 1,755,171.

SUMMARY

However, in the case where a plurality of photons are made incident to an APD at short time intervals, an interval between the output pulse signals is shortened, to be unable to perform pulse separation, which makes it incapable of photon counting. The present invention has been achieved in consideration of such a problem, and an object of the present invention is to provide a high dynamic range photodiode array with a high counting rate.

In order to solve the above-described problem, a photodiode array according to an aspect of the present invention, comprises a light receiving region, wherein the light receiving region includes a plurality of light detecting sections, and each of the light detecting sections comprises: a first semiconductor region of a first conductivity type, a second semiconductor region of a second conductivity type, the second semiconductor region forming a p-n junction with the first semiconductor region, a first contact electrode being in contact with the second semiconductor region, a second contact electrode having a material different from that of the first contact electrode, the second contact electrode being arranged at a position overlapping the first contact electrode and being in contact with the first contact electrode, and a resistive layer continued to the second contact electrode.

In the case of the photodiode array according to the present aspect, by arranging the second contact electrode at a position overlapping the first contact electrode, it is possible to minimize a space required for the connection of the resistive layer and the first contact electrode. It is a matter of course that the first contact electrode and the second contact electrode are naturally not in the same plane, to be different in height position, and the resistive layer is continuously extended from the second contact electrode. Thus it is possible to omit wiring in the light detecting sections, which makes it possible to considerably increase an aperture ratio of the light detecting sections.

Carriers generated in the p-n junction by incidence of photons flow in the resistive layer via the first contact electrode and the second contact electrode, to be taken out to the outside via the wiring pattern connected to the resistive layer.

Further, the second contact electrode and the resistive layer preferably have SiCr. Because SiCr has high optical transmittance, even when a resistive layer is present in the light detecting sections, incident photons are allowed to transmit through the resistive layer, and therefore, it is possible to increase an effective aperture ratio.

Further, the resistive layer is preferably extended in a curvilinear manner, to be connected to the wiring pattern for signal readout. Because a resistance value of the resistive layer is proportional to its length, provided that the resistive layer is extended in a curvilinear manner, it is possible to increase a resistance value. Further, by the presence of the resistive layer, it is possible to stabilize a surface level of the semiconductor layer which is present thereunder, to stabilize the outputs.

Further, a thickness of the resistive layer is preferably 3 nm or more and 50 nm or less. When it is the lower limit or more, it is possible to secure the uniformity of the resistive layer, and when it is the upper limit or less, it is possible to allow photons to transmit through the resistive layer sufficiently.

The wiring pattern includes a shape surrounding each of the light detecting sections, each of the second contact electrodes is located in the central area of each light detection region surrounded by the wiring pattern, and a two-dimensional pattern of the resistive layer includes a shape extended so as to turn around the second contact electrode. By arranging the second contact electrode in the central area of the light detection region, so as to turn around the second contact electrode, it is possible to set the length of the resistive layer to be longer.

Further, in the case where photons are made incident to the light detecting sections, a recovery time which is stipulated by a period from a clock time of having an intensity peak value of an output from the light detecting sections to a clock time at which the output from the light detecting sections reaches 37% of the intensity peak value, may be set to 5 ns or less.

Further, an interval between the centers of the adjacent light detecting sections may be set to 20 μm or less. In this case, the recovery time is considerably shortened.

Further, an interval between the centers of the adjacent light detecting sections may be set to 15 μm or less. In this case, the recovery time is further shortened.

Further, an interval between the centers of the adjacent light detecting sections may be set to 10 μm or less. In this case, the recovery time is furthermore shortened.

In accordance with the photodiode according to the aspect of the present invention, it is possible to have a high count rate by shortening its recovery time.

BRIEF DESCRIPTION OF THE DRAWINGS

FIG. 13 is a longitudinal sectional view of a photodiode array in which a structure of its substrate is changed.

DETAILED DESCRIPTION

Figure 1:
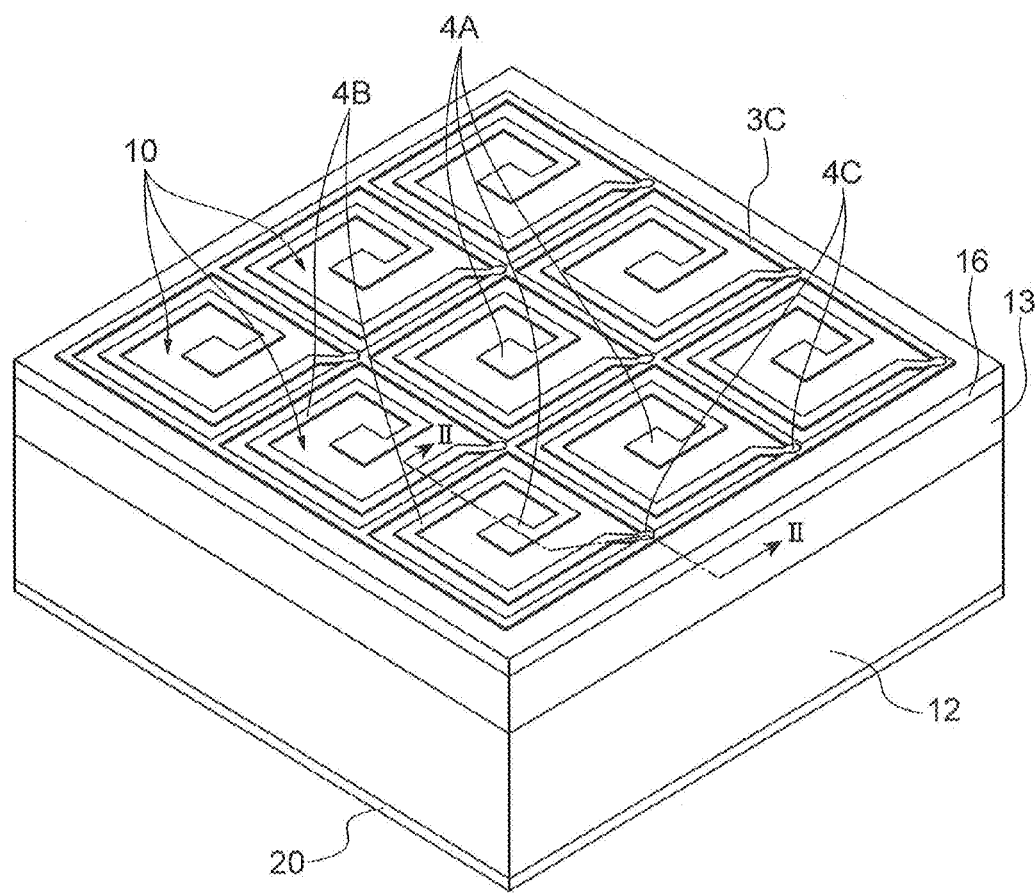
FIG. 1 is a perspective view of a photodiode array.

Hereinafter, a photodiode array according to an embodiment will be described. In addition, the same reference numerals are to be used for the same components, and overlapping descriptions will be omitted.

Figure 2:
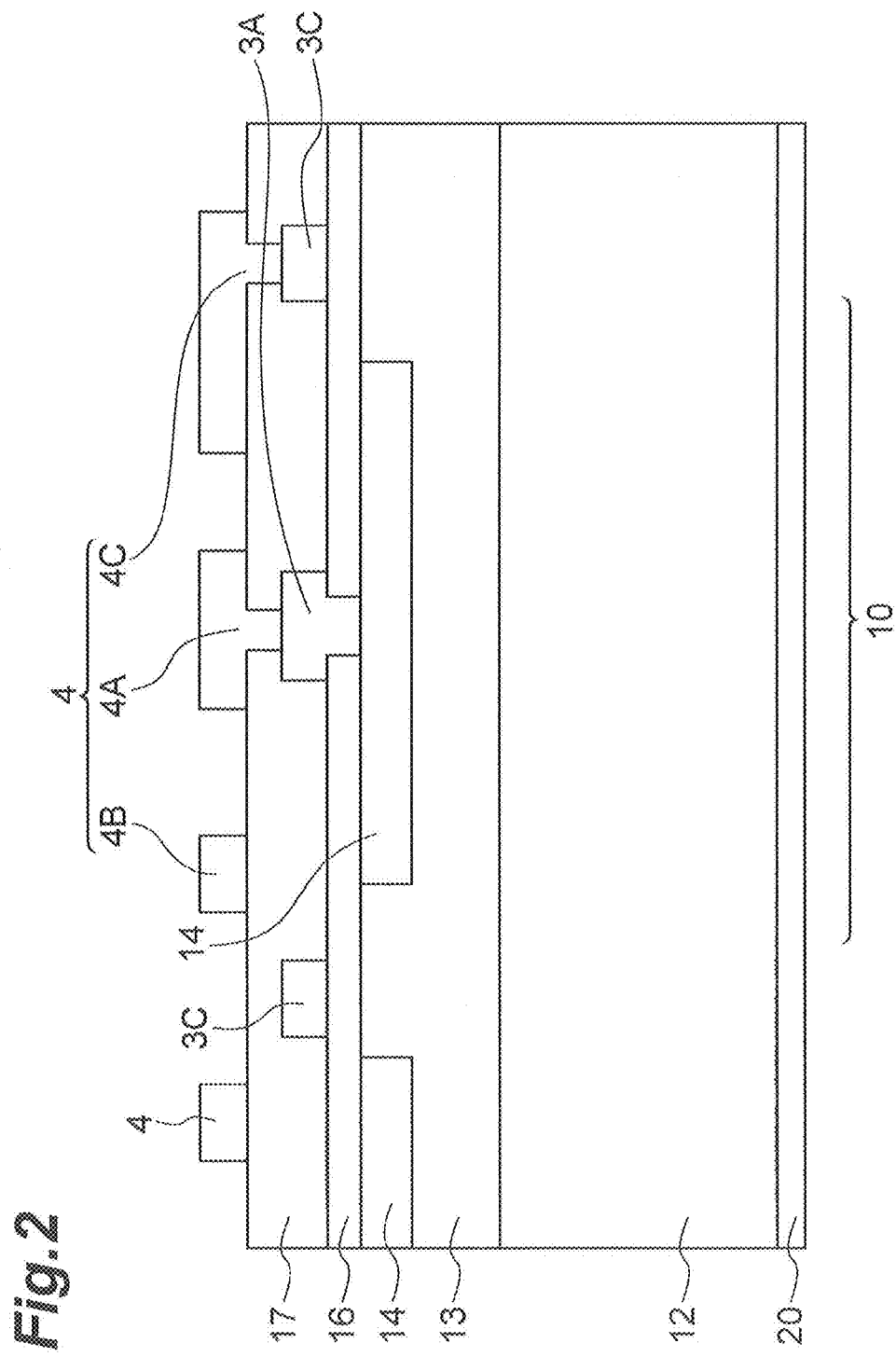
FIG. 2 is a longitudinal sectional view taken along arrows II to II of the photodiode array.

FIG. 1 is a perspective view of a photodiode array, and FIG. 2 is a longitudinal sectional view taken along arrows II to II of the photodiode array.

This photodiode array has a light receiving region on the surface side of a semiconductor substrate made of Si. The light receiving region includes a plurality of light detecting sections (light detection channels) 10, and these light detecting sections 10 are two-dimensionally arrayed in a matrix state. In addition, the light detecting sections 10 in three rows and in three columns are arrayed, and these compose the light receiving region. Meanwhile, the number of the light detecting sections 10 may be larger or smaller, and may be configured to be one-dimensionally arrayed.

A wiring pattern (top surface electrode) 3C for signal readout, which is subjected to lattice-shaped patterning, is arranged on the substrate surface. In addition, in FIG. 1, description of an insulating layer 17 shown in FIG. 2 is omitted in order to make the internal structure clear. The inside of the apertures of the lattice-shaped wiring pattern 3C stipulates light detection regions. The light detecting sections 10 are arrayed in the light detection region, and the outputs of the light detecting sections 10 are connected to the wiring pattern 3C.

A bottom surface electrode 20 is provided on the substrate rear surface. Accordingly, provided that a driving voltage for the light detecting sections 10 is applied between the wiring pattern 3C serving as the top surface electrode and the bottom surface electrode 20, it is possible to take out its light detection output from the wiring pattern 3C.

In the p-n junction, the p-type semiconductor region composing the p-n junction composes an anode, and the n-type semiconductor region composes a cathode. In the case where a driving voltage is applied to the photodiode so as to make an electric potential of the p-type semiconductor region higher than an electric potential of the n-type semiconductor region, this is a forward bias voltage, and in the case where a driving voltage opposite thereto is applied to the photodiode, this is a reverse bias voltage.

The driving voltage is a reverse bias voltage to be applied to the photodiode, which is composed of the internal p-n junction in the light detecting sections 10. In the case where this driving voltage is set to a breakdown voltage or less of the photodiode, an avalanche breakdown occurs in the photodiode, and the photodiode is operated in the Geiger mode. That is, each photodiode is an avalanche photodiode (APD). In addition, in the case where a forward bias voltage is applied to the photodiode as well, the photodiode has a light detection function.

A resistive part (quenching resistor) 4 which is electrically connected to one end of the photodiode is arranged on the substrate surface. One end of the resistive part 4 composes a contact electrode 4A which is electrically connected to one end of the photodiode via a contact electrode of a different material which is located immediately below this, and the other end composes a contact electrode 4C which contacts the wiring pattern 3C for signal readout, to be electrically connected to the wiring pattern 3C. That is, the resistive parts 4 in the respective light detecting sections 10 are provided with the contact electrodes 4A connected to the photodiode, the resistive layer 4B extended in a curvilinear manner so as to be continued to the contact electrodes 4A, and the contact electrodes 4C continued to the terminal end portion of the resistive layer 4B. In addition, the contact electrode 4A, the resistive layer 4B, and the contact electrode 4C are composed of resistive layers of the same resistance material, and these are continued to each other.

In this way, the resistive part 4 is extended in a curvilinear manner from the electrical connecting point with the photodiode, to be connected to the wiring pattern 3C for signal readout. Because a resistance value of the resistive part 4 is proportional to its length, the resistive part 4 is extended in a curvilinear manner, thus it is possible to increase the resistance value. Further, provided that the resistive part 4 is present, it is possible to stabilize a surface level of the semiconductor region present under the resistive part 4, to stabilize the output.

In the example shown in FIG. 1, the wiring pattern 3C includes a shape surrounding each of the light detecting sections 10. However, the shape of the wiring pattern 3C is not limited to this shape, and for example, the wiring pattern 3C may be formed into a shape surrounding two or more of the light detecting sections 10, or a shape surrounding one or more columns of the light detecting sections 10 (refer to FIG. 14). In addition, in FIG. 14, a plurality of rows of light detecting sections are set as one group, and the wiring of the wiring pattern 3C is extended thereamong.

Figure 14:
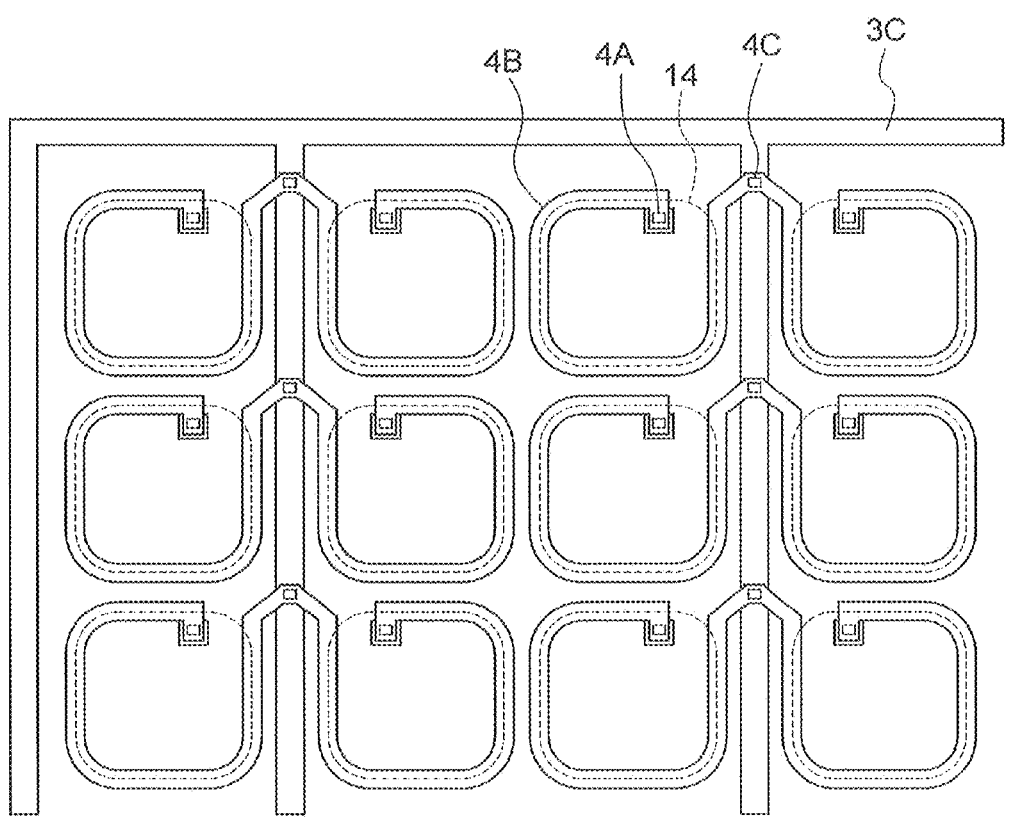
FIG. 14 is a plan view of a photodiode array.

Further, as shown in FIG. 14, by arranging the resistive layer 4B so as to cover the edge of a semiconductor region 14 in each of the light detecting sections 10, it is possible to stabilize a surface level of the semiconductor region 14. To describe in detail, the resistive layer 4B is arranged on the outline form of the semiconductor region 14, which is viewed from the thickness direction.

One ends of the photodiodes included in the light detecting sections 10 are essentially connected to the wiring pattern 3C of the same electric potential at all the positions, and the other ends are connected to the bottom surface electrode 20 providing a substrate potential. That is, the photodiodes in all the light detecting sections 10 are connected in parallel.

In addition, in place of the bottom surface electrode 20, a hole reaching the semiconductor region 12 from the substrate surface side may be opened, and the inner face of the hole is coated with an insulating film, to thereafter form a through-silicon via contacting the semiconductor region 12. However, in order to improve the aperture ratio of the light detecting sections 10, the bottom surface electrode 20 is preferable to a through-silicon via.

In the example shown in FIG. 1, each of contact electrodes 4A is located in the central area of each light detection region surrounded by the wiring pattern 3C. Then, the two-dimensional pattern of the resistive part 4 includes a shape extended so as to turn around the contact electrodes 4A. Provided that the contact electrodes 4A are arranged in the central area of the respective light detection regions, and the resistive layer 4B is arranged so as to turn around the contact electrodes 4A, it is possible to set the length of the resistive layer 4B to be longer.

As shown in FIG. 2, each of the light detecting sections 10 is provided with a first conductivity type (n-type) first semiconductor region (layer) 12, and a second conductivity type (p-type) second semiconductor region (a semiconductor layer 13 and a high-impurity concentration region 14) composing a p-n junction with the first semiconductor region 12.

A first contact electrode 3A contacts the high-impurity concentration region (semiconductor region) 14 in the second semiconductor region. The high-impurity concentration region 14 is a diffused region (semiconductor region) formed by diffusing impurities in the semiconductor layer 13, and has an impurity concentration higher than that of the semiconductor layer 13. In this example (Type 1), the p-type semiconductor layer 13 is formed on the n-type first semiconductor region 12, and the p-type high-impurity concentration region 14 is formed on the surface side of the semiconductor layer 13. Accordingly, the p-n junction composing the photodiode is formed between the semiconductor region 12 and the semiconductor layer 13.

In addition, as a layer structure of the semiconductor substrate, a structure in which the conductivity types are reversed from those described above may be adopted. That is, the structure of (Type 2) is formed such that the n-type semiconductor layer 13 is formed on the p-type first semiconductor region 12, and the n-type high-impurity concentration region 14 is formed on the surface side of the semiconductor layer 13.

Further, the p-n junction interface may be formed on the surface layer side. In this case, the structure of (Type 3) is a structure in which the n-type semiconductor layer 13 is formed on the n-type first semiconductor region 12, and the p-type high-impurity concentration region 14 is formed on the surface side of the semiconductor layer 13. In addition, in the case of this structure, the p-n junction is formed at the interface between the semiconductor layer 13 and the semiconductor region 14.

It is a matter of course that it is possible to reverse the conductivity types in such a structure. That is, the structure of (Type 4) is a structure in which the p-type semiconductor layer 13 is formed on the p-type first semiconductor region 12, and the n-type high-impurity concentration region 14 is formed on the surface side of the semiconductor layer 13.

In addition, a structure shown in FIG. 13 may be adopted as a structure of the semiconductor substrate.

FIG. 13 is a longitudinal sectional view of a photodiode array in which a structure of its substrate is changed.

This structure is different from the structures of Type 1 to Type 4 described above in the point that a semiconductor region 15 is arranged immediately below the semiconductor region 14, and the other points are the same as each other. The semiconductor region 15 has the same conductivity type as that of the semiconductor region 14, or a different conductivity type therefrom. The semiconductor region 15 having the same conductivity type is considered as (Type 1S) to (Type 4S), and the semiconductor region 15 having a different conductivity type is considered as (Type 1D) to (Type 4D). In addition, the impurity concentration in the semiconductor region 15 is lower than the impurity concentration in the semiconductor region 14. Further, as a p-type impurity, B (boron) may be adopted, and as an n-type impurity, P (phosphorus) or As (arsenic) may be adopted.

In addition, the conductivity types, and the preferable ranges of impurity concentrations and thicknesses of the respective layers in the above-described semiconductor structures are as follows.

(Type 1)
The semiconductor region 12 (conductivity type/impurity concentration/thickness)(n-type/$5\times10^{11}$ to $1\times10^{20}$ cm$^{-3}$/30 to 700 μm)
The semiconductor region 13 (conductivity type/impurity concentration/thickness)(p-type/$1\times10^{14}$ to $1\times10^{17}$ cm$^{-3}$/2 to 50 μm)
The semiconductor region 14 (conductivity type/impurity concentration/thickness)(p-type/$1\times10^{18}$ to $1\times10^{20}$ cm$^{-3}$/10 to 1000 nm)

(Type 2)
The semiconductor region 12 (conductivity type/impurity concentration/thickness)(p-type/$5\times10^{11}$ to $1\times10^{20}$ cm$^{-3}$/30 to 700 μm)
The semiconductor region 13 (conductivity type/impurity concentration/thickness)(n-type/$1\times10^{14}$ to $1\times10^{17}$ cm$^{-3}$/2 to 50 μm)
The semiconductor region 14 (conductivity type/impurity concentration/thickness)(n-type/$1\times10^{18}$ to $1\times10^{20}$ cm$^{-3}$/10 to 1000 nm)

(Type 3)
The semiconductor region 12 (conductivity type/impurity concentration/thickness)(n-type/$5\times10^{11}$ to $1\times10^{20}$ cm$^{-3}$/30 to 700 μm)
The semiconductor region 13 (conductivity type/impurity concentration/thickness)(n-type/$1\times10^{14}$ to $1\times10^{17}$ cm$^{-3}$/2 to 50 μm)
The semiconductor region 14 (conductivity type/impurity concentration/thickness)(p-type/$1\times10^{18}$ to $1\times10^{20}$ cm$^{-3}$/10 to 1000 nm)

(Type 4)
The semiconductor region 12 (conductivity type/impurity concentration/thickness)(p-type/$5\times10^{11}$ to $1\times10^{20}$ cm$^{-3}$/30 to 700 μm)
The semiconductor region 13 (conductivity type/impurity concentration/thickness)(p-type/$1\times10^{14}$ to $1\times10^{17}$ cm$^{-3}$/2 to 50 μm)
The semiconductor region 14 (conductivity type/impurity concentration/thickness)(n-type/$1\times10^{18}$ to $1\times10^{20}$ cm$^{-3}$/10 to 1000 nm)

(Type 1S)
The parameters of the semiconductor regions 12, 13, and 14 are the same as those of Type 1.
The semiconductor region 15 (conductivity type/impurity concentration/thickness)(p-type/$1\times10^{14}$ to $1\times10^{17}$ cm$^{-3}$/2 to 50 μm)

(Type 2S)
The parameters of the semiconductor regions 12, 13, and 14 are the same as those of Type 2.
The semiconductor region 15 (conductivity type/impurity concentration/thickness)(n-type/$1\times10^{14}$ to $1\times10^{17}$ cm$^{-3}$/2 to 50 μm)

(Type 3S)
The parameters of the semiconductor regions 12, 13, and 14 are the same as those of Type 3.
The semiconductor region 15 (conductivity type/impurity concentration/thickness)(p-type/$1\times10^{14}$ to $1\times10^{17}$ cm$^{-3}$/2 to 50 μm)

(Type 4S)
The parameters of the semiconductor regions 12, 13, and 14 are the same as those of Type 4.
The semiconductor region 15 (conductivity type/impurity concentration/thickness)(n-type/$1\times10^{14}$ to $1\times10^{17}$ cm$^{-3}$/2 to 50 μm)
(Type 1D)
The parameters of the semiconductor regions 12, 13, and 14 are the same as those of Type 1.
The semiconductor region 15 (conductivity type/impurity concentration/thickness)(n-type/$1\times10^{14}$ to $1\times10^{17}$ cm$^{-3}$/2 to 50 μm)
(Type 2D)
The parameters of the semiconductor regions 12, 13, and 14 are the same as those of Type 2.
The semiconductor region 15 (conductivity type/impurity concentration/thickness)(p-type/$1\times10^{14}$ to $1\times10^{17}$ cm$^{-3}$/2 to 50 μm)
(Type 3D)
The parameters of the semiconductor regions 12, 13, and 14 are the same as those of Type 3.
The semiconductor region 15 (conductivity type/impurity concentration/thickness)(n-type/$1\times10^{14}$ to $1\times10^{17}$ cm$^{-3}$/2 to 50 μm)
(Type 4D)
The parameters of the semiconductor regions 12, 13, and 14 are the same as those of Type 4.
The semiconductor region 15 (conductivity type/impurity concentration/thickness)(p-type/$1\times10^{14}$ to $1\times10^{17}$ cm$^{-3}$/2 to 50 μm)

In addition, in the above-mentioned example, the lowermost semiconductor region 12 composes the semiconductor substrate having a wide thickness. Meanwhile, the light detecting sections 10 may be further provided with a semiconductor substrate under the semiconductor region 12, and in this case, the semiconductor region 12 is to have a thickness thinner than such an additional semiconductor substrate.

Further, the semiconductor region 13 may be formed on the semiconductor region 12 by an epitaxial growth method. Meanwhile, the semiconductor region 13 may be formed by impurity diffusion or ion implantation with respect to the substrate. The semiconductor regions 14 and 15 may be formed by impurity diffusion or ion implantation with respect to the semiconductor region 13.

Next, the contact electrode 3A and the resistive part 4 shown in FIGS. 1, 2, and 13 will be described.

The respective light detecting sections 10 are provided with an insulating layer 16 formed on the surface of the semiconductor substrate. The surfaces of the semiconductor region 13 and the semiconductor region 14 are coated with the insulating layer 16. The insulating layer 16 has a contact hole, and the contact electrode 3A is formed in the contact hole. The contact electrode 3A in this example is made of the same material as that of the wiring pattern 3C, and is formed on the insulating layer 16 through the same process. The contact electrode 3A and the wiring pattern 3C are made of metal, which is specifically aluminum (Al). Another low-resistance metal material (Au, Ag, Cu) may be used as a material for the contact electrode 3A and the wiring pattern 3C, and a structure of two or more layers or an alloy may be adopted. As an alloy, for example, a compound containing some of the metallic elements such as Al, Ag, Au, Ge, Ni, Cr, and Ti may be used.

An upper insulating layer 17 is formed on the lower insulating layer 16 and the first contact electrode 3A. The insulating layers 16 and 17 are made of inorganic insulators having high heat resistance such as $SiO_2$ or silicon nitride (SiNx). The insulating layer 17 has a contact hole arranged coaxially with the first contact electrode 3A, and a second contact electrode 4A is formed in the contact hole. Accordingly, the first contact electrode 3A and the second contact electrode 4A are coaxially-arranged.

The second contact electrode 4A contains a material different from the first contact electrode 3A. Further, the second contact electrode 4A is a part of the resistive part 4, and has a resistivity higher than that of the first contact electrode 3A. The second contact electrode 4A is arranged at a position overlapping the first contact electrode 3A, so as to contact the first contact electrode 3A. The resistive layer 4B is continued to the second contact electrode 4A.

By coaxially-arraying the second contact electrode 4A at a position overlapping the first contact electrode 3A, it is possible to minimize a space required for the connection of the resistive layer 4B and the first contact electrode 3A. It is a matter of course that the first contact electrode 3A and the second contact electrode 4A are naturally not in the same plane, to be different in height position, and the resistive layer 4B is continuously extended from the second contact electrode 4A. Thus it is possible to omit wiring in the light detecting sections 10, which makes it possible to considerably increase an aperture ratio of the light detecting sections.

In addition, the contact electrode 4C is located at the terminal end of the resistive layer 4B. The contact electrode 4C as well is a part of the resistive part 4. The wiring pattern 3C formed on the insulating layer 16 is located immediately below the contact electrode 4C, and the contact electrode 4C contacts the wiring pattern 3C, to be connected to the wiring pattern 3C.

Carriers generated in the p-n junction by incidence of photons flow in the resistive layer 4B via the first contact electrode 3A and the second contact electrode 4A, and are taken out to the outside via the wiring pattern 3C connected to the resistive layer 4B via the contact electrode 4C.

The contact electrodes 4A and 4C, and the resistive layer 4B are made of the same resistance material. Meanwhile, these may be made of different materials. A single semiconductor, or an alloy or a compound containing a semiconductor and metal in an appropriate ratio may be used as a resistance material. For example, as a resistive element, NiCr, TaNi, FeCr, or the like may be cited in addition to SiCr.

It is a matter of course that the contact electrodes 4A and 4C, and the resistive layer 4B are preferably made of SiCr. Because SiCr has high optical transmittance, even when a resistive layer is present in the light detecting sections 10, because incident photons are allowed to transmit through the resistive layer 4B, it is possible to increase an effective aperture ratio. In addition, wafer in-plane variation in resistance value of SiCr is small, and it is possible to easily thin it by approximately 1 mm. Further, it is possible to heighten sheet resistance. A sheet resistance of polysilicon is 1 to 30 (kΩ/sq.). Meanwhile, a sheet resistance of SiCr is 1 to 50 (kΩ/sq.). That is, provided that SiCr is used, it is possible to achieve a high resistance value with a small size.

The thickness of the resistive layer 4B is preferably 3 nm or more and 50 nm or less. When it is the lower limit or more, it is possible to secure the uniformity of the resistive layer, and when it is the upper limit or less, it is possible to allow photons to transmit through the resistive layer sufficiently.

Figure 3:
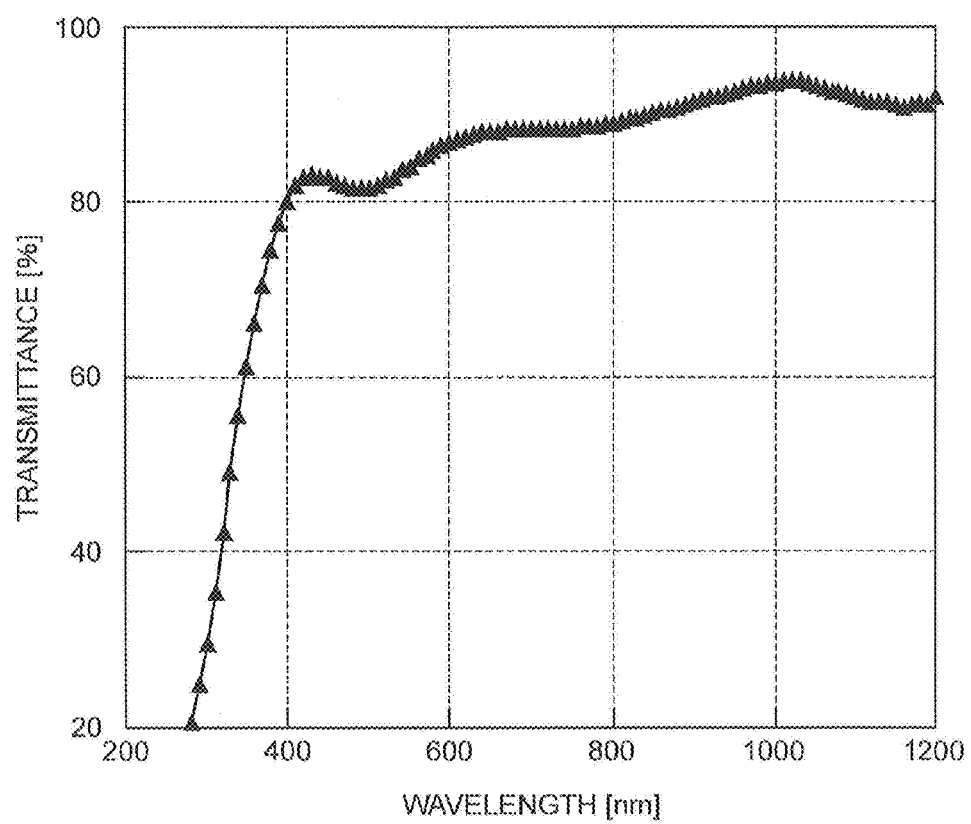
FIG. 3 is a graph showing a relationship between the wavelength (nm) and the transmittance (%) of incident light to SiCr.

FIG. 3 is a graph showing a relationship between the wavelength (nm) and the transmittance (%) of incident light to SiCr composing the resistive layer. The thickness of this SiCr is 20 nm.

SiCr has transmittance of 80% or more with respect to light with a wavelength of 400 nm or more. SiCr has a trend toward blocking of light with a wavelength less than 400 nm. In accordance with the graph, a small spectral peak is shown with respect to the light with a wavelength of 400 nm or more and less than 500 nm. This means that it is possible to selectively allow the light with a wavelength of 400 nm or more and less than 500 nm to transmit through even when the light of 500 nm or more is blocked by a filter. Provided that such a filter is not combined, it is possible to allow light with a wavelength of 400 nm or more, at least light with a wavelength up to 1200 nm to transmit through at transmittance of 80% or more.

The above-described photodiode array was manufactured.
The manufacturing conditions are as follows.
(1) The Structure (Numerical Samples in the Structure in FIGS. 1 and 2)
  The semiconductor 12:
  Conductivity type: n-type (impurity: Sb (antimony))
  Impurity concentration: $5.0 \times 10^{11}$ cm$^{-3}$
  Thickness: 650 μm
  The semiconductor 13:
  Conductivity type: p-type (impurity: B (boron))
  Impurity concentration: $1.0 \times 10^{14}$ cm$^{-3}$
  Thickness: 30 μm
  The semiconductor 14:
  Conductivity type: p-type (impurity: B (boron))
  Impurity concentration: $1.0 \times 10^{18}$ cm$^{-3}$
  Thickness: 1000 nm
  The insulating layer 16: SiO$_2$ (thickness: 1000 nm)
  The insulating layer 17: SiO$_2$ (thickness: 2000 nm)
  The contact electrode 3A: (aluminum (Al))
  Contact hole diameter: 2.0 μm
  The wiring pattern 3C: (aluminum (Al))
  Thickness: 1.0 μm
  Width W0 of the wiring pattern 3C: 1.0 to 3.0 μm
  Area S of the region (light detection region) surrounded by the wiring pattern 3C in the one light detecting sections 10: 100 to 2500 μm$^2$
  Interval X between the centers of the adjacent light detecting sections 10: 50 μm to 10 μm
  The resistive part 4: SiCr
(The Contact Electrode 4A)
  Contact hole diameter: 1.0 μm
(The Resistive Layer 4B)
  Thickness of the resistive layer 4B: 20 nm
  Width W1 of the resistive layer 4B: 1.0 to 3.0 μm
  Length L1 of the resistive layer 4B: 10 to 50 μm
  Resistance value of the resistive part 4: 200 to 500 kΩ
(The Contact Electrode 4C)
  Contact hole diameter: 1.0 μm
(2) Conditions of Manufacturing Process
  The semiconductor region 12: Czochralski method ((001) Si semiconductor substrate)
  The semiconductor region 13: Si epitaxial growth method (raw materials: gas-phase silicon tetrachloride (SiCl$_4$), trichlorosilane (SiHCl$_3$), growth temperature of 1200° C.)
  The semiconductor region 14: Impurity thermal diffusion method (impurity raw material: diborane (B$_2$H$_6$), diffusion temperature of 1200° C.)
  The insulating layer 16: (Si thermo-oxidative method: oxidizing temperature (1000° C.))
  The insulating layer 17: (Plasma CVD method: raw material gas (tetraethoxysilane (TEOS) and oxygen gas): growth temperature (200° C.))
  The contact electrode 3A and the wiring pattern 3C: Vapor-deposition technique (raw material: aluminum)
  The resistive part 4: Sputtering method (target material: SiCr)

Figure 4:
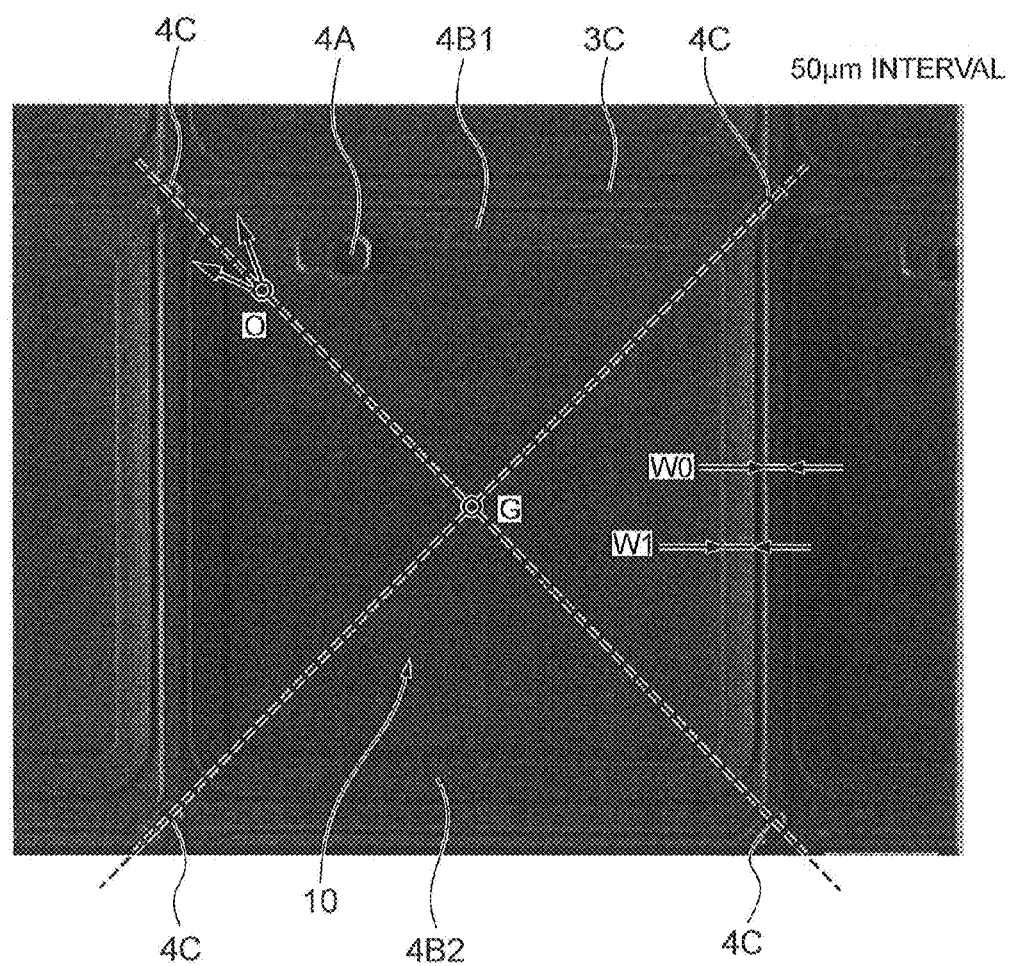
FIG. 4 is a diagram showing a photograph of a light detecting sections (arrayed at intervals of 50 μm).

FIG. 4 is a diagram showing a photograph of the manufactured light detecting sections 10 (an interval X between the adjacent centers=50 μm).
The parameters of the structure in this example are as follows. In addition, the length of the resistive layer 4B is a length of the center line in the width direction.
  Width W0 of the wiring pattern 3C=2.0 μm
  Area S of the light detection region=2025 μm$^2$
  Width W1 of the resistive layer 4B=3.0 μm
  Length (total length) L1 of the resistive layer 4B=200 μm
  Resistance value of the resistive part 4=160 kΩ

The shape of the resistive layer 4B is formed annularly as a whole along the inner side surface of the lattice-shaped wiring pattern 3C. In this structure, the resistive layer 4B has two channels from the position of the second contact electrode 4A to the contact electrode 4C for signal output. That is, the resistive layer 4B has a resistive layer 4B1 having a relatively short length, and a resistive layer 4B2 having a relatively long length. A resistance value of the resistive layer 4B is given as a combined resistance of these resistive layer 4B1 and resistive layer 4B2 having different lengths.

The contact electrodes 4C are arranged at the intersection points of the lattice-shaped wiring pattern 3C. Accordingly, the contact electrodes 4C are located at the four places on the diagonals of the light detection region, and the intersection point of these diagonals is the center (center of gravity) G of the light detection region (light detecting sections). A distance X between the centers G of the adjacent light detecting sections is 10 is 50 μm.

The resistive layers 4B1 and 4B2 express a substantially rectangular annular shape as a whole, and the shapes of those corners are smoothly curved. The centers of curvature O of the outer edges of the corners of the resistive layers 4B1 and 4B2 are located on the above-mentioned diagonals passing through the center and the radii of curvature R are 5.0 μm, and the angles θ formed by the two chords extended from the both ends of the outer edge arcing toward the centers of curvature O are 8°. In addition, the radii of curvature R are set to 2 to 10 μm in order to avoid electric field concentration, and the angles θ are set to 3 to 14°.

The carriers taken out of the second contact electrode 4A reach the contact electrode 4C via the resistive layer 4B, to be taken out to the outside via the wiring pattern 3C.

Figure 5:
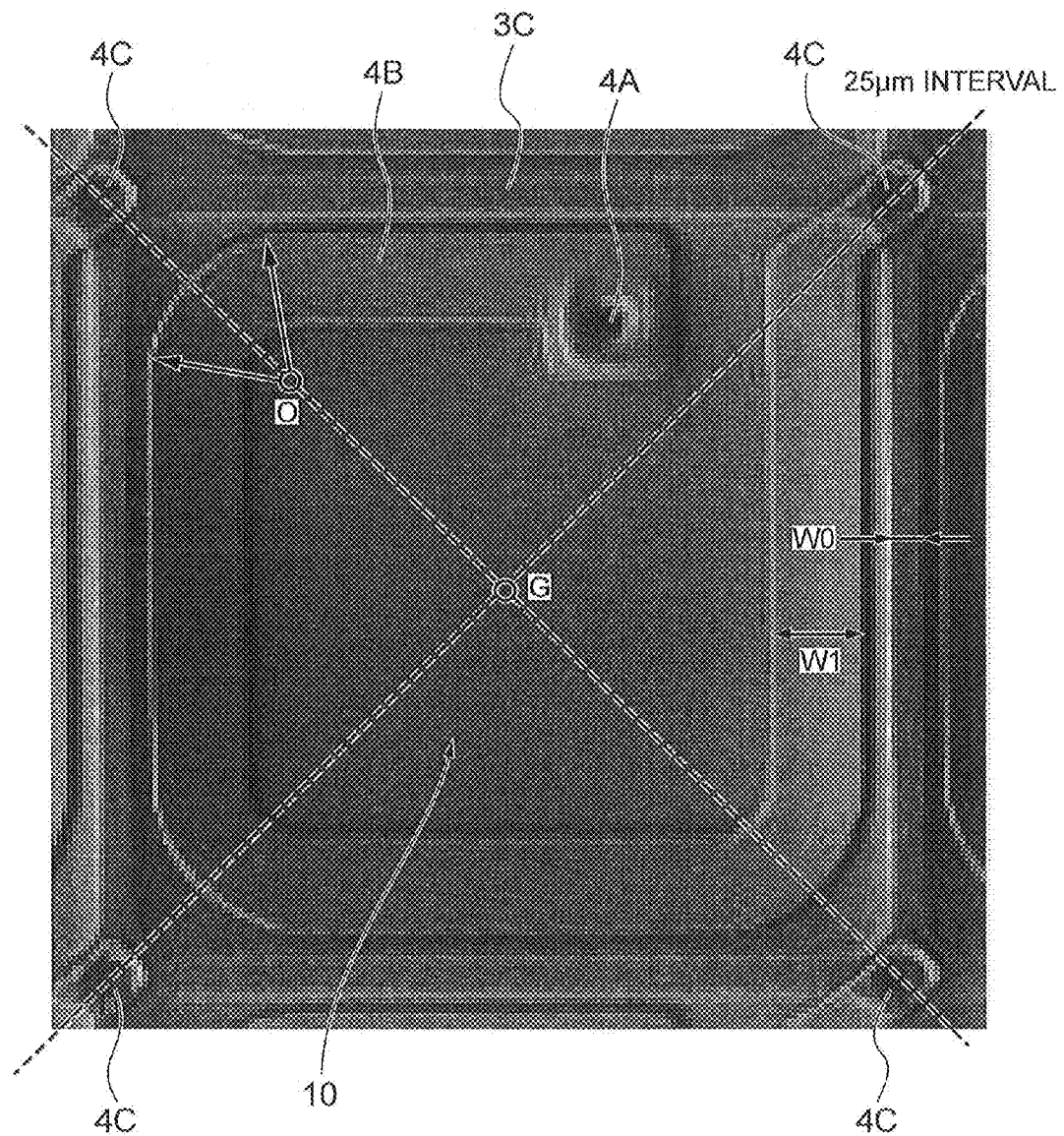
FIG. 5 is a diagram showing a photograph of a light detecting sections (arrayed at intervals of 25 μm).

FIG. 5 is a diagram showing a photograph of the manufactured light detecting sections 10 (an interval X between the adjacent centers=25 μm).
The parameters of the structure in this example are as follows.
  Width W0 of the wiring pattern 3C=1.5 μm
  Area S of the light detection region=420 μm$^2$
  Width W1 of the resistive layer 4B=3.0 μm
  Length L1 of the resistive layer 4B=70 μm
  Resistance value of the resistive part 4=250 kΩ

The shape of the resistive layer 4B is formed, as a whole, into a shape in which a part of a ring is void, along the inner side surface of the lattice-shaped wiring pattern 3C. In this structure, the resistive layer 4B has one channel from the position of the second contact electrode 4A to the contact electrode 4C for signal output.

The contact electrodes 4C are arranged at the intersection points of the lattice-shaped wiring pattern 3C. Accordingly, the contact electrodes 4C are located at the four places on the diagonals of the light detection region, and the intersection point of these diagonals is the center (center of gravity) G of the light detection region (light detecting sections). A distance X between the centers G of the laterally-adjacent light detecting sections 10 is 25 μm.

The resistive layer 4B has three corners composing a part of the ring shape, and the shapes of the respective corners are smoothly curved. The centers of curvature O of the outer edges of the corners of the resistive layer 4B are located on the above-mentioned diagonals passing through the center G, and the radii of curvature R are 5.0 μm, and the angles θ formed by the two chords extended from the both ends of the outer edge arcing toward the centers of curvature O are 8°. In addition, the radii of curvature R are set to 2 to 10 μm in order to avoid electric field concentration, and the angles θ are set to 6 to 37°.

The carriers taken out of the second contact electrode 4A reach the contact electrode 4C via the resistive layer 4B, to be taken out to the outside via the wiring pattern 3C.

Figure 6:
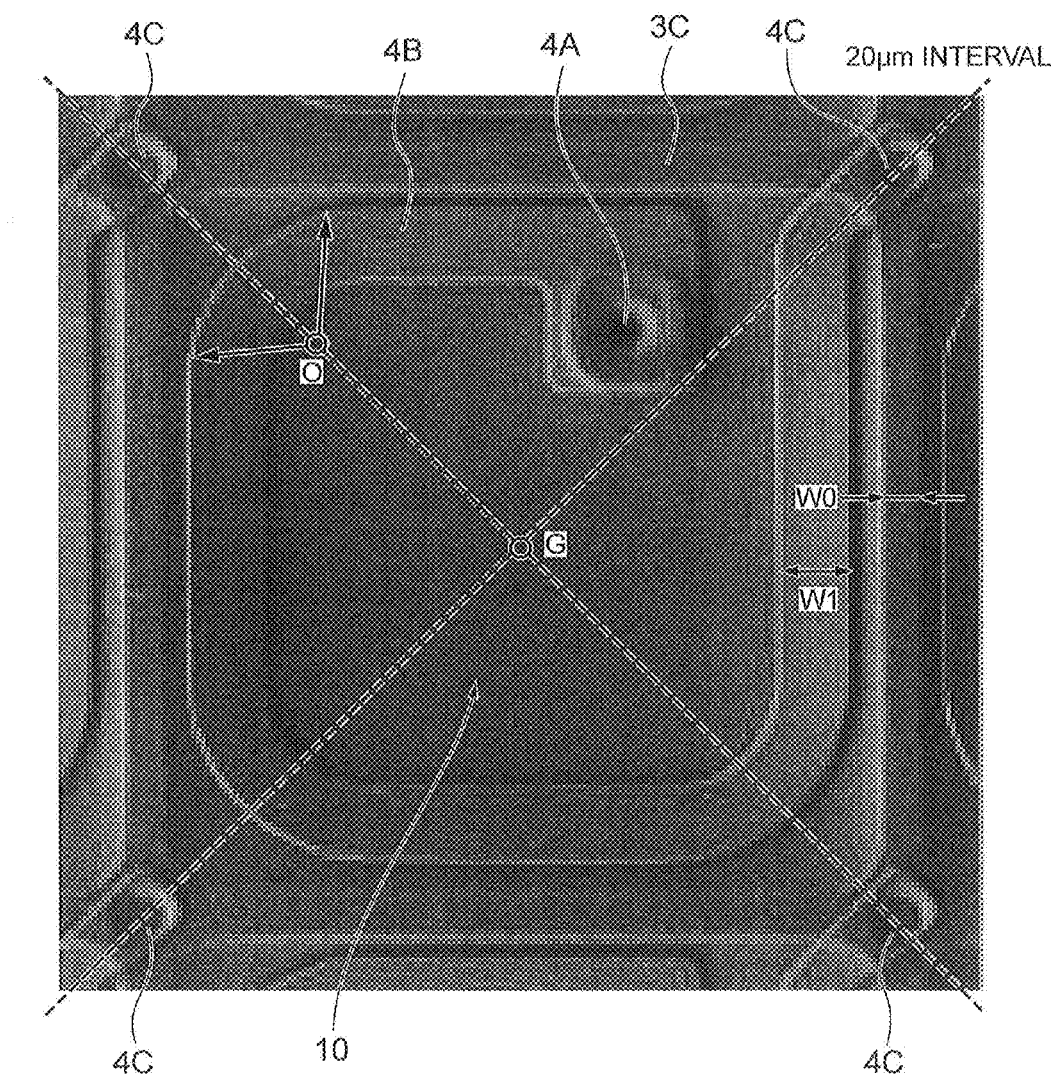
FIG. 6 is a diagram showing a photograph of a light detecting sections (arrayed at intervals of 20 μm).

FIG. 6 is a diagram showing a photograph of the manufactured light detecting sections 10 (an interval X between the adjacent centers=20 μm).

The parameters of the structure in this example are as follows.

Width W0 of the wiring pattern 3C=1.5 μm
Area S of the light detection region=240 μm$^2$
Width W1 of the resistive layer 4B=2.0 μm
Length L1 of the resistive layer 4B=55 μm
Resistance value of the resistive part 4=300 kΩ

The basic structure of the light detecting sections is the same as that shown in FIG. 5, and overlapping descriptions will be omitted. A distance X between the centers G of the adjacent light detecting sections 10 is 20 μm. As a different point, in the case of that shown in FIG. 6, the proportion of the contact electrode 4A projecting toward the inside of the light detection region to the width W1 of the resistive layer 4B is higher than that in FIG. 5. In addition, in the light detecting sections in any embodiment, the centers of the contact electrodes 4A and 4C are concave. A distance between the wiring pattern 3C adjacent to the contact electrode 4C and the center position of the contact electrode 4A is longer than a distance from the wiring pattern 3C to the inner edge line of the resistive layer 4B.

The resistive layer 4B has three corners composing a part of the ring shape, and the shapes of the respective corners are smoothly curved. The centers of curvature O of the outer edges of the corners of the resistive layer 4B are located on the above-mentioned diagonals passing through the center G, and the radii of curvature R are 3.0 μm, and the angles θ formed by the two chords extended from the both ends of the outer edge arcing toward the centers of curvature O are 13°. In addition, the radii of curvature R are set to 2 to 5 μm in order to avoid electric field concentration, and the angles θ are set to 8 to 23°.

The carriers taken out of the second contact electrode 4A reach the contact electrode 4C via the resistive layer 4B, to be taken out to the outside via the wiring pattern 3C.

Figure 7:
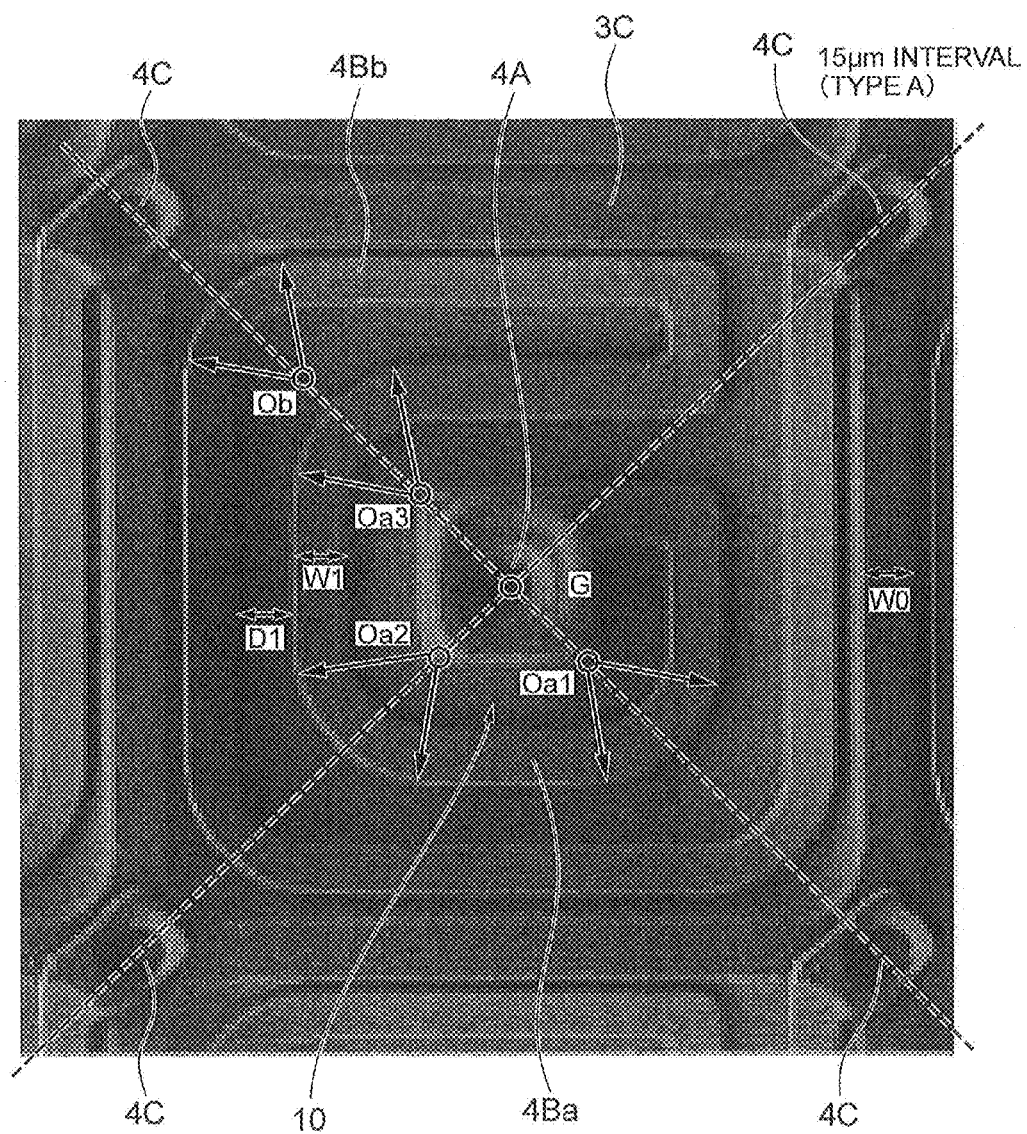
FIG. 7 is a diagram showing a photograph of a light detecting sections (arrayed at intervals of 15 μm: Type A).

FIG. 7 is a diagram showing a photograph of the manufactured light detecting sections (an interval X between the adjacent centers=15 μm: Type A). In the light detecting sections of Type A, the contact electrode 4A is arranged in the center of the light detection region, and the resistive layer 4B is provided with a forward turning region 4Ba extended so as to turn clockwise from the center, and a reverse turning region 4Bb extended so as to turn counterclockwise continuously from the forward turning region 4Ba. In addition, here, a clockwise turning is considered as a forward turning. It is a matter of course that it is possible to manufacture one having a structure in which a counterclockwise turning is considered as a forward turning.

The parameters of the structure in this example are as follows.

Width W0 of the wiring pattern 3C=1.2 μm
Area S of the light detection region=132 μm$^2$
Width W1 of the resistive layer 4B=1.0 μm
Length L1 of the resistive layer 4B=78 μm
Resistance value of the resistive part 4=600 kΩ

The contact electrodes 4C are arranged at the intersection points of the lattice-shaped wiring pattern 3C, and the contact electrodes 4C are located at the four places on the diagonals of the light detection region. The intersection point of these diagonals is the center (center of gravity) G of the light detection region (light detecting sections). A distance X between the centers G of the adjacent light detecting sections 10 is 15 μm.

As described above, the resistive layer 4B is provided with the forward turning region 4Ba and the reverse turning region 4Bb. In this structure, the resistive layer 4B has one channel from the position of the second contact electrode 4A to the contact electrode 4C for signal output. However, the direction of the magnetic field at the center G formed by the respective regions 4Ba and 4Bb having different turning directions is reversed. That is, this light detecting sections has a structure in which the effect by the magnetic field formed due to the progress of detected electrons is balanced out at the center position, thereby reducing the effect on detected output by the self-forming magnetic field.

The forward turning region 4Ba has gently-curved three corners. The centers of curvature Oa1, Oa2, and Oa3 of the outer edges of the respective corners are located on the above-mentioned diagonals passing through the center and the respective radii of curvature Ra are 2.0 μm, and the angles θa formed by the two chords extended from the both ends of the respective outer edge arcing toward the respective centers of curvature Oa1, Oa2, and Oa3 are 19°. In addition, with respect to the forward turning region 4Ba, the radii of curvature Ra of the corners are set to 2 to 5 μm in order to avoid electric field concentration, and the angles θa are set to 19 to 58°.

The reverse turning region 4Bb as well has gently-curved three corners, and the respective corners have the same shape other than its direction. To describe one angle, the centers of curvature Ob of the outer edge of the corner are located on the above-mentioned diagonals passing through the center G, and the radius of curvature Rb is 2.0 μm, and the angle θb formed by the two chords extended from the both ends of the outer edge arcing toward the respective centers of curvature Ob is 8°. In addition, with respect to the reverse turning region 4Bb, the radius of curvature Rb of the corner is set to 2 to 5 μm in order to avoid electric field concentration, and the angle θb is set to 8 to 23°.

In addition, for the reason that the forward turning region 4Ba is located internally than the reverse turning region 4Bb, the angle θa is set to be greater than the angle θb.

The outer edge of the forward turning region 4Ba located internally and the inner edge of the reverse turning region 4Bb located externally face each other. The minimum value D1 as a distance spaced between these is 0.6 μm. The minimum value D1 as a spaced distance is set to 0.6 to 2.0 μm.

The carriers taken out of the second contact electrode 4A reach the contact electrode 4C via the resistive layer 4B, to be taken out to the outside via the wiring pattern 3C.

Figure 8:
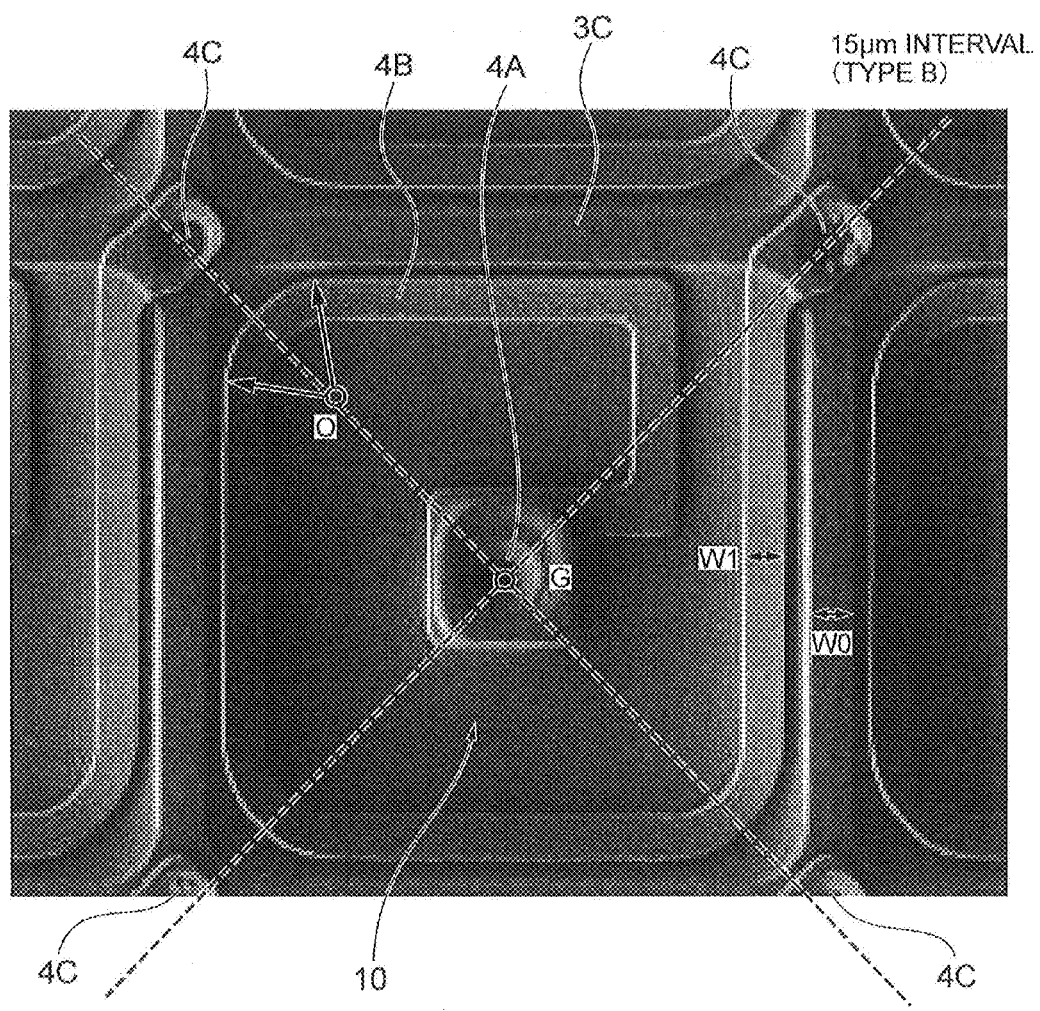
FIG. 8 is a diagram showing a photograph of a light detecting sections (arrayed at intervals of 15 μm: Type B).

FIG. 8 is a diagram showing a photograph of the manufactured light detecting sections (an interval X between the adjacent centers=15 μm: Type B).

In the light detecting sections of Type B, the contact electrode 4A is arranged in the center of the light detection region, and the resistive layer 4B is provided with a turning region extended so as to turn in one direction from the center. It is a matter of course that it is possible to manufacture the light detecting sections having a structure in which the turning direction is the reverse direction in any one of the embodiments.

The parameters of the structure in this example are as follows.
  Width W0 of the wiring pattern 3C=1.2 μm
  Area S of the light detection region=132 μm²
  Width W1 of the resistive layer 4B=1.0 μm
  Length L1 of the resistive layer 4B=55 μm
  Resistance value of the resistive part 4=420 kΩ

The contact electrodes 4C are arranged at the intersection points of the lattice-shaped wiring pattern 3C, and the contact electrodes 4C are located at the four places on the diagonals of the light detection region. The intersection point of these diagonals is the center (center of gravity) G of the light detection region (light detecting sections). A distance X between the centers G of the adjacent light detecting sections 10 is 15 μm.

The resistive layer 4B has gently-curved three corners. The centers of curvature O of the outer edges of the respective corners are located on the above-mentioned diagonals passing through the center and the respective radii of curvature R are 2.0 μm, and the angles θ formed by the two chords extended from the both ends of the respective outer edge arcing toward the respective centers of curvature O are 8°. In addition, the radii of curvature R of the corners are set to 2 to 5 μm in order to avoid electric field concentration, and the angles θ are set to 8 to 23°.

The carriers taken out of the second contact electrode 4A reach the contact electrode 4C via the resistive layer 4B, to be taken out to the outside via the wiring pattern 3C.

Figure 9:
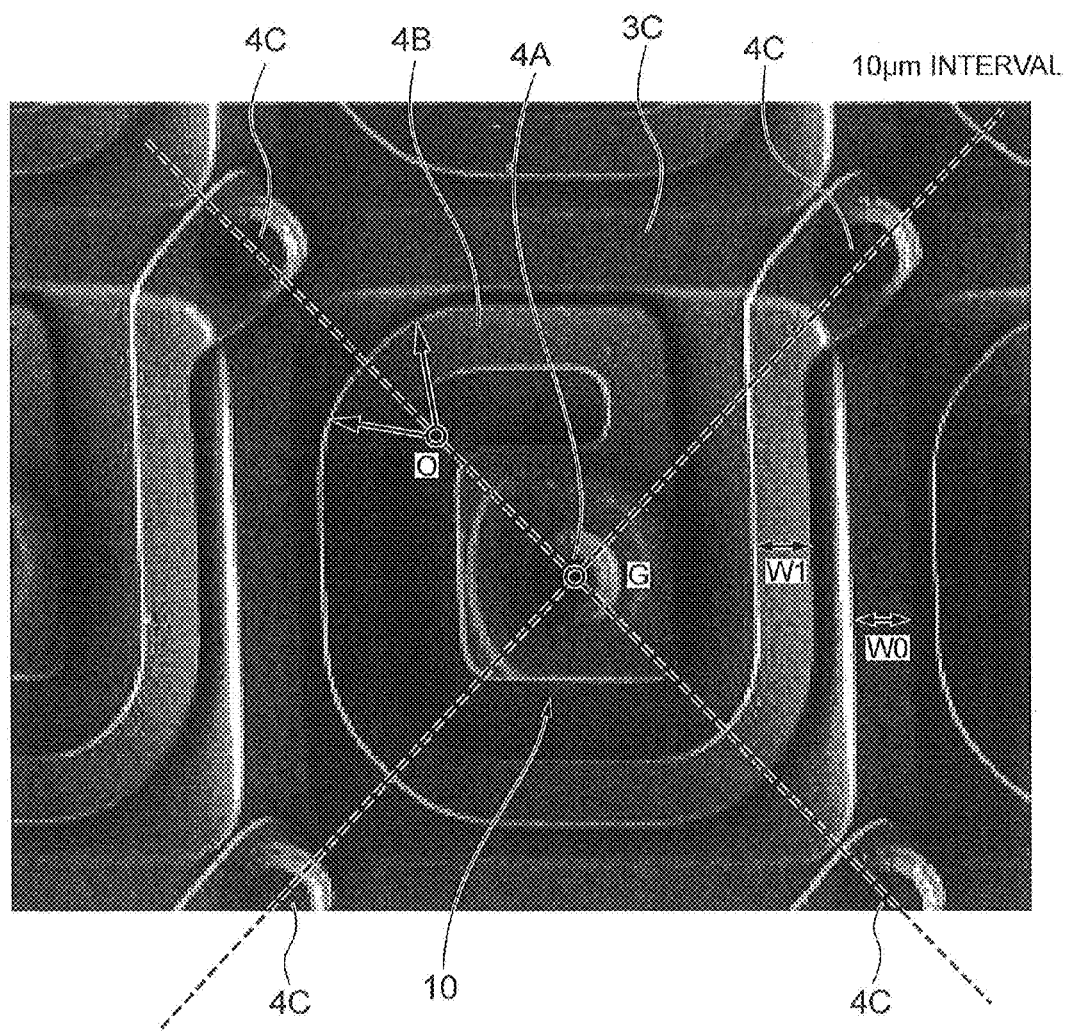
FIG. 9 is a diagram showing a photograph of a light detecting sections (arrayed at intervals of 10 μm).

FIG. 9 is a diagram showing a photograph of the manufactured light detecting sections (an interval X between the adjacent centers=10 μm). The basic structure of the light detecting sections 10 is the same as that shown in FIG. 8, and descriptions of the same structure will be omitted.

The parameters of the structure in this example are as follows.
  Width W0 of the wiring pattern 3C=1.2 μm
  Area S of the light detection region=42 μm²
  Width W1 of the resistive layer 4B=1.0 μm
  Length L1 of the resistive layer 4B=29 μm
  Resistance value of the resistive part 4=700 kΩ.

In this structure as well, the carriers taken out of the second contact electrode 4A reach the contact electrode 4C via the resistive layer 4B, to be taken out to the outside via the wiring pattern 3C.

In addition, in this example, despite the fact that the width W1 of the resistive layer 4B is less than the width W0 of the wiring pattern 3C, and the resistive part 4 is miniaturized, it is possible to obtain a sufficient resistance value.

Next, the characteristics of the photodiode will be described.

Figure 10:
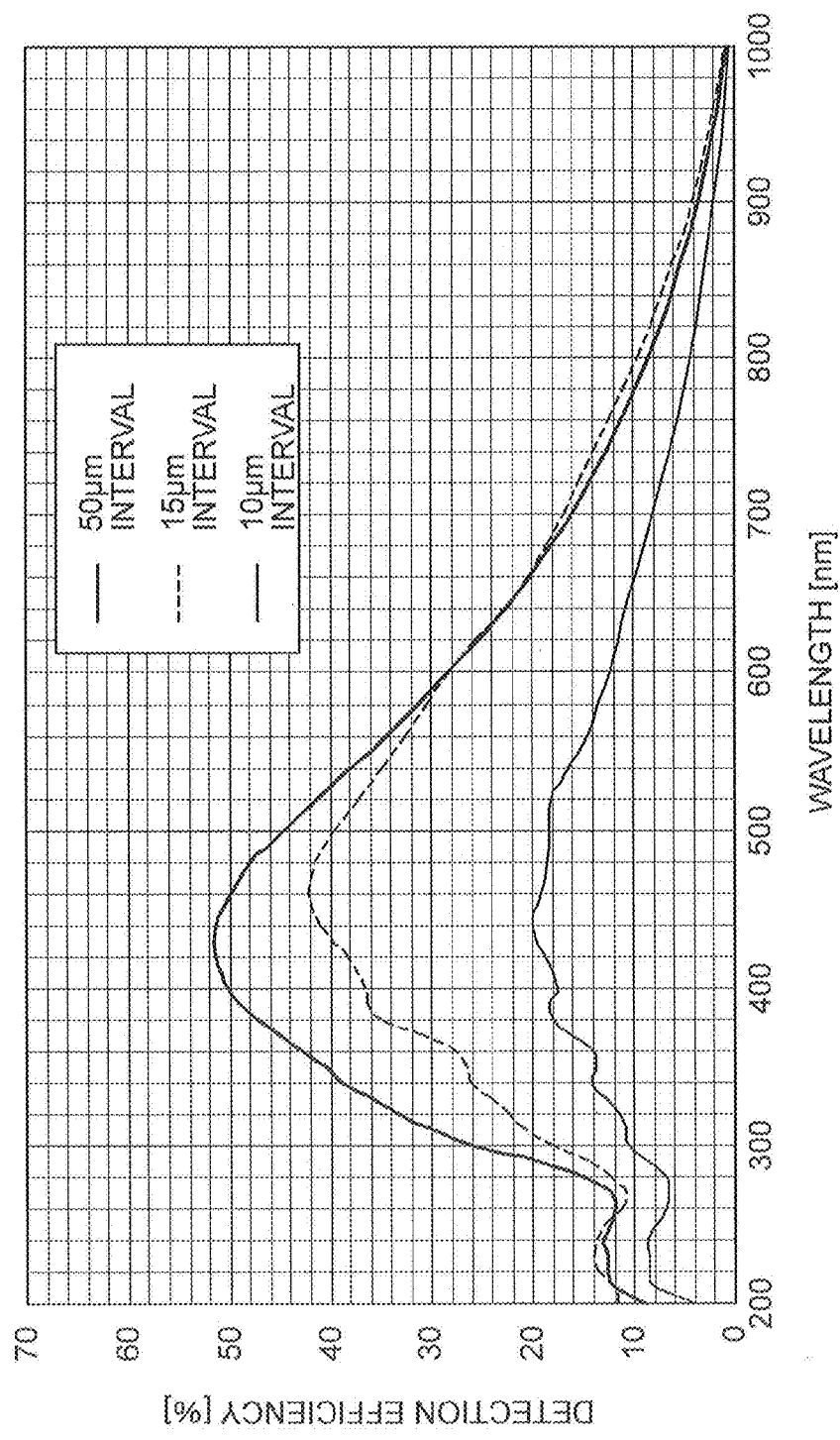
FIG. 10 is a graph showing a relationship between the wavelength (nm) of incident light and the detection efficiency (%) of photons.
Figure 11A:
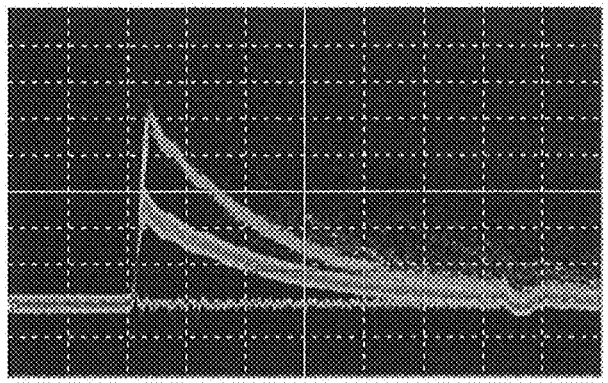
FIGS. 11A, 11B, 11C, and 11D are graphs showing relationships between the output of photodiode and the time.
Figure 11B:
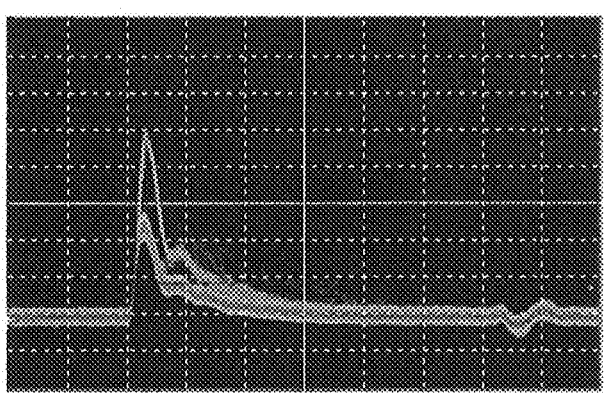
Figure 11C:
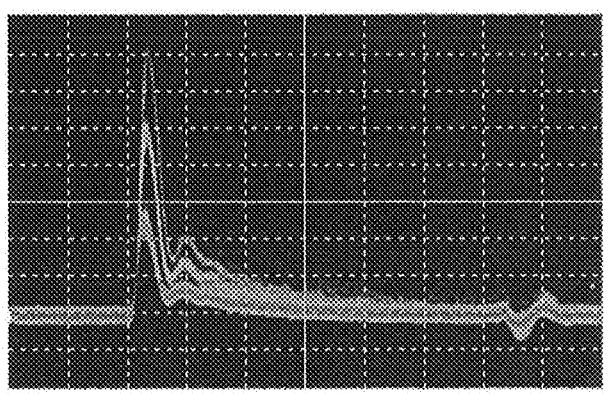
Figure 11D:
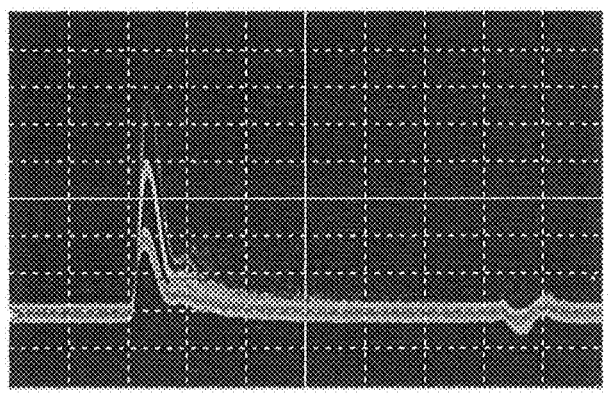

FIG. 10 is a graph showing a relationship between the wavelength (nm) of incident light and the detection efficiency (%) of photons in the above-mentioned photodiode. The graph shows the data of the structure of FIG. 4 (an interval of 50 μm), the structure of FIG. 7 (an interval of 15 μm), and the structure of FIG. 9 (an interval of 10 μm). In addition, the numbers of the light detecting sections included in one photodiode array are respectively 400, 4489, and 1000. A reverse bias voltage to the photodiode is 74V, and the photodiode was operated in the Geiger mode. In addition, a breakdown voltage is 71V.

With respect to the photon detection efficiency (PDE) (%), the larger the light detection region is, the less the shadow region by the resistive layer is, and the higher the detection efficiency is obtained. However, despite the fact that the area of the light detection region when an interval between adjacent light detection regions is 10 μm is about one twenty-fifth the area of the light detection region when an interval between adjacent light detection regions is 50 μm, the detection efficiency is maintained at 30% or more thereof. In the same way when an interval between adjacent light detection regions is 15 μm, the detection efficiency is maintained at a relatively high percentage.

The positions of these spectral peaks are present within a wavelength range from 400 nm to 500 nm. Within this wavelength range (400 nm or more and 500 nm or less), in the case of the photodiode at intervals of 50 μm, the detection efficiency is 44% or more, and in the case of the photodiode at intervals of 15 μm, the detection efficiency is 36% or more, and in the case of the photodiode at intervals of 10 μm, the detection efficiency is 17% or more.

In addition, as a comparison example 1, with an interval X between adjacent centers=50 μm, a first contact electrode was provided at an inner position of the resistive layer in FIG. 4, and an annular wiring pattern (aluminum) which has substantially the same shape as, but is slightly smaller than that of the resistive layer 4B was formed from the first contact electrode. In addition, this annular wiring pattern (overhanging electrode) is located on the outline form of the semiconductor region 14, and has a function of stabilizing a surface level in the light detection region. Then, in the case where a resistive element (polysilicon: 160 kΩ) continued to the annular wiring pattern, with the same width of the annular wiring pattern, is formed in the same way as that shown in FIG. 4, the detection efficiency (%) was 44% at minimum, and was 52% at maximum within the wavelength range from 400 nm to 500 nm. In addition, in the structure of the comparison example 1, the position of the first contact electrode and the connecting position with the annular wiring pattern of the resistive element are shifted from each other.

Further, as a comparison example 2, with an interval X in the comparison example 1=15 μm, a first contact electrode was provided at an inner position of the resistive layer in FIG. 8, and an annular wiring pattern (aluminum) which has substantially the same shape as, but is slightly smaller than that of the resistive layer 4B was formed from the first contact electrode. In addition, this annular wiring pattern (overhanging electrode) is located on the outline form of the semiconductor region 14, and has a function of stabilizing a surface level in the light detection region. Then, in the case where a resistive element (polysilicon: 500 kΩ) continued to the annular wiring pattern, with the same width of the annular wiring pattern, is formed in the same way as that shown in FIG. 8, the detection efficiency (%) was 36% at minimum, and was 42% at maximum within the wavelength range from 400 nm to 500 nm. In addition, in the structure of the comparison example 2, the position of the first contact electrode and the connecting position with the annular wiring pattern of the resistive element are shifted from each other.

In addition, because the position of the first contact electrode and the connecting position with the annular wiring pattern of the resistive element are shifted from each other, it is difficult to set an interval X=10 μm or less in view of the manufacturing process.

In the structures of the comparison examples 1 and 2, all the annular wiring patterns and resistive parts having low optical transmittance function as light blocking components to reduce an active aperture ratio, and the light detection sensitivity is lowered. On the other hand, in the photodiode array according to the embodiment, because the resistive layer 4B has high optical transmittance while achieving the same surface level stabilizing function as that of the annular wiring pattern, and further, an additional resistive element such as polysilicon is not used, it is possible to considerably improve the light detection sensitivity.

Next, an inspection with respect to an effect by a recovery time (voltage recovery time) was carried out.

FIGS. 11A to 11D are graphs showing relationships between the output (in the Geiger mode) from the above-mentioned photodiode and the time. The graphs show the output images on an oscilloscope, and the vertical axes show the output intensity (gain) of the photodiode, and an interval in the vertical axis denotes 50 mV, and an interval in the horizontal axis denotes 5 (ns). On the graphs, multiple data having different peak intensity voltages are shown. However, this is due to a difference in the number of photons made incident to the photodiode, and the larger the number of photons is, the higher the output intensity becomes. On the graphs, a bias voltage of 73 (V) is applied. In addition, ΔV=bias voltage to the photodiode-breakdown voltage of the photodiode is within a range of ΔV=1 (V) or more and 4 (V) or less.

In the case where photons are made incident to the light detecting sections 10, a recovery time (τ) of an output signal from the photodiode is stipulated by a period from a clock time of having an intensity peak value of an output from the light detecting sections 10 to a clock time at which the output from the light detecting sections 10 reaches 37% of the intensity peak value.

In the case (FIG. 11A) of an interval X between the light detecting sections=50 μm (FIG. 4), when a bias voltage to the photodiode is 73 V, the recovery time (τ) is 13 ns.

In the case (FIG. 11B) of an interval X between the light detecting sections=20 μm (FIG. 6), when a bias voltage to the photodiode is 73 V, the recovery time (τ) is 5.0 ns.

In the case (FIG. 11C) of an interval X between the light detecting sections=15 μm (Type A: FIG. 7), when a bias voltage to the photodiode is 73 V, the recovery time (τ) is 4.3 ns.

In the case (FIG. 11D) of an interval X between the light detecting sections=10 μm, when a bias voltage to the photodiode is 73 V, the recovery time (τ) may be 2.3 ns or less.

In addition, in the case of the above-mentioned comparison example 1, the recovery time (τ) was 13 ns, and in the case of the above-mentioned comparison example 2, the recovery time (τ) was 5.0 ns.

To describe in detail, in the case of the structure of the comparison example 1 (an interval X of a space between the light detecting sections 10=50 μm), the aperture ratio is 60%, the junction capacitance Cj=80 fF, the gain=$7.5 \times 10^5$, the recovery time is 13 ns, the pixel count density (400 pixels/mm$^2$), and the photon detection efficiency is 52% at maximum.

Further, in the case of the structure of the comparison example 2 (an interval X of a space between the light detecting sections 10=15 μm), the aperture ratio is 55%, the junction capacitance Cj=11 fF, the gain=$2.0 \times 10^5$, the recovery time is 4.3 ns, the pixel count density (4489 pixels/mm$^2$), and the photon detection efficiency is 42% at maximum.

In addition, in the case of X=15 μm, in the structures of the embodiment of FIGS. 7 and 8, the aperture ratio may be set to 60%, the junction capacitance Cj=11 fF, the gain=$2.0 \times 10^5$, the recovery time is 4.3 ns, and the pixel count density (4489 pixels/mm$^2$).

In this way, in the structure of the embodiment, while achieving the same aperture ratio as that of the comparison example 1, it is possible to reduce the junction capacitance Cj, and to shorten the recovery time. Further, because the pixel count included per unit area is large, it is possible to improve the dynamic range.

As described above, in the case where an interval X of adjacent second contact electrodes (an interval between the centers of the light detecting sections) is 20 μm or less, the recovery time (τ) is considerably shortened. When an interval X between the light detecting sections is 15 μm or less, it is possible to make the recovery time (τ) 10 ns or less. When an interval X is set to 10 μm or less, the recovery time (τ) is further shortened. This is remarkable improvement which has not been achieved conventionally.

As described above, in the photodiode array according to the embodiment, by utilizing the high transmittance of the metal thin film resistor, an overhanging structure is formed of the metal thin film resistor subjected to linear patterning in place of the overhanging electrode used in the comparison examples 1 and 2, to reduce a dead space. In order to obtain a desired resistance value, in the case of the structures shown in FIGS. 5 to 9, it is impossible to coat a portion (the position in the right corner) of the outline form (edge) of the semiconductor region 14 with the resistive layer 4B. However, this portion is about the width of the resistive layer 4B, which has a small effect on deterioration in characteristics with respect to stabilization of surface level. Further, in the structure shown in FIG. 4, all the outline form (edge) of the semiconductor region 14 is coated.

Figure 12A:
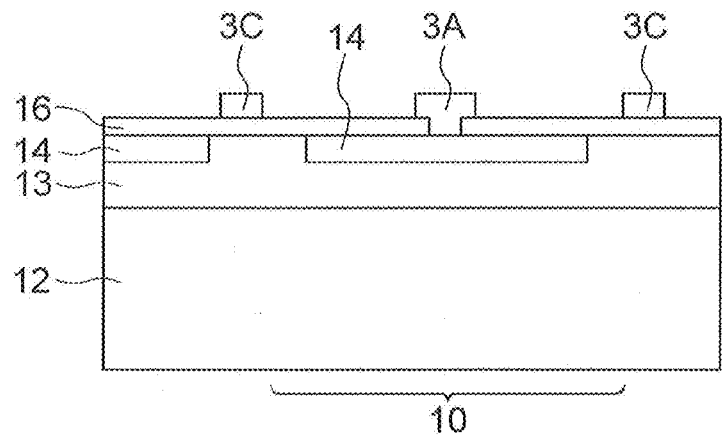
FIGS. 12A, 12B, and 12C are diagrams for explanation of a method of manufacturing a photodiode.
Figure 12B:
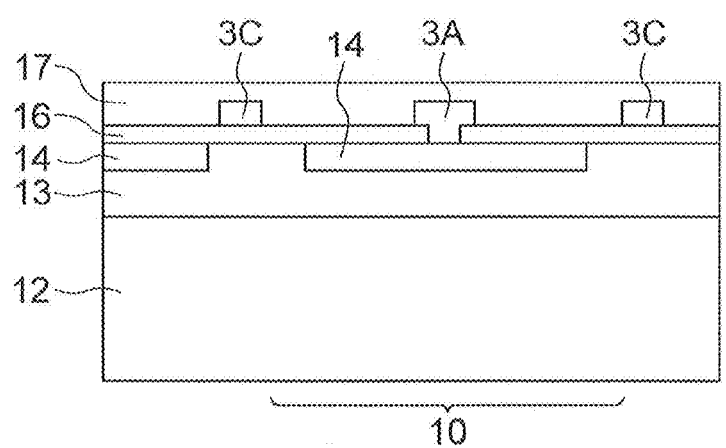
Figure 12C:
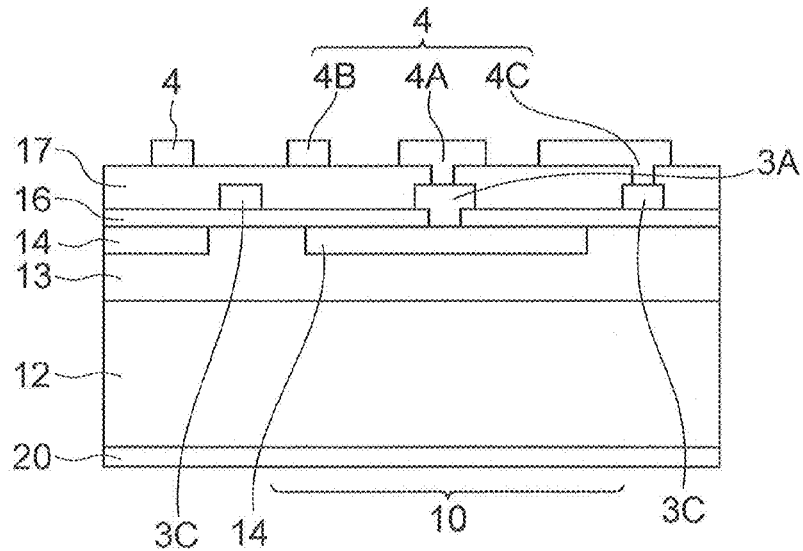

FIGS. 12A to 12C are diagrams for explaining a method of manufacturing the photodiode array shown in FIGS. 1 and 2.

First, as shown in FIG. 12A, a semiconductor region 13 is formed on the semiconductor region (semiconductor substrate) 12 by an epitaxial growth method, an impurity diffusion method, or an ion implantation method. In addition, the semiconductor region 12 is a semiconductor substrate of (100) Si formed by the Czochralski method or the floating zone method. However, a semiconductor substrate having another plane orientation may be used. In the case where an Si epitaxial growth method is used, for example, gas-phase silicon tetrachloride ($SiCl_4$) and trichlorosilane ($SiHCl_3$) are used as raw materials, and those gases are made to flow on the substrate surface at a growth temperature of 1200° C. In the case of an impurity diffusion method, impurities corresponding to the conductivity type of the semiconductor region 13 are diffused as gas or solid in the semiconductor region 12. In the case of an ion implantation method, impurities corresponding to the conductivity type of the semiconductor region 13 are ion-implanted into the semiconductor region 12.

Next, the semiconductor region 14 is formed on the region on the surface side of the semiconductor region 13. For this, an impurity diffusion method or an ion implantation method may be used. For example, in the case where diborane ($B_2H_6$) is used as a raw material in a diffusion method, the diffusion temperature may be set to 1200° C. In the formation of the semiconductor region 14, first, a resist pattern having an aperture is formed on the semiconductor region 13 by a technique of photolithography, and next, impurity addition is carried out with this resist pattern serving as a mask. In addition, after the lattice-shaped wiring pattern 3C is formed, impurity addition may be carried out with this lattice-shaped wiring pattern 3C serving as a mask via the insulating layer 16 by an ion implantation method.

Next, the insulating layer 16 is formed on the semiconductor substrate. The insulating layer 16 may be formed by use of an Si thermal oxidation method. The oxidizing temperature is, for example, 1000° C. Thus, the surfaces of the semiconductor regions 13 and 14 are oxidized, to form the insulating layer 16 made of SiO$_2$. A CVD method may be used for the formation of the insulating layer 16.

Next, a contact hole is formed at a position on the semiconductor region 14 in the insulating layer 16. In the formation of the contact hole, first, a resist pattern having an aperture is formed on the insulating layer 16 by a technique of photolithography, and next, the insulating layer 16 is etched with this resist pattern serving as a mask. As an etching method, in addition to a dry etching method, wet etching with an etchant containing an HF solution may be used.

Next, the first contact electrode 3A and the wiring pattern 3C are formed on the insulating layer 16 by a vapor-deposition technique. In the formation of these, first, a predetermined resist pattern is formed on the insulating layer 16 by a technique of photolithography, and next, an electrode material is vapor-deposited on the insulating layer 16 with this resist pattern serving as a mask. Here, in place of a vapor-deposition technique, a sputtering method may be used.

Next, as shown in FIG. 12B, the insulating layer 17 is formed on the insulating layer 16. The insulating layer 17 may be formed by use of a sputtering method or a plasma CVD method. In the case where a plasma CVD method is used, tetraethoxysilane (TEOS) and oxygen gas are used as raw material gases, and the growth temperature is set to approximately 200° C., to carry out the growth of the insulating layer 17. The thickness of the insulating layer 17 is preferably set to a thickness in which it is possible to planarize its surface, and is preferably higher than a height from the surface of the insulating layer 16 to the top surface of the wiring pattern 3C.

Next, as shown in FIG. 12C, the resistive part 4 is formed on the insulating layer 17. In the formation of this, first, a predetermined resist pattern is formed on the insulating layer 17 by a technique of photolithography, and next, a resistance material is deposited on the insulating layer 17 by use of a sputtering method or a vapor-deposition technique by using this resist pattern serving as a mask. In the case where the resistive element is made of SiCr, a sputtering method is used, and as a target material, for example, SiCr with a composition ratio of Si and Cr of 70%/30% may be used, and the thickness may be set to 3 to 50 nm.

In addition, in the case where the light detecting sections having the structure shown in FIG. 13 is manufactured, it is recommended that the semiconductor region 15 be formed on the surface side of the semiconductor region 13 by use of an impurity diffusion method or an ion implantation method before the formation of the semiconductor region 14. In the case of an impurity diffusion method, impurities corresponding to the conductivity type of the semiconductor region 15 are diffused as gas or solid in the semiconductor region 13. In the case of an ion implantation method, impurities corresponding to the conductivity type of the semiconductor region 15 are ion-implanted into the semiconductor region 13.

In addition, in the case of the above-described embodiment, the planar shape of the resistive layer 4B is a shape of a part of an annular or ring shape, or a spiral form. However, this may be a meandering shape like a square wave, a triangle wave, or a sine wave.

Further, the effects of the photodiode array according to the embodiment will be further described.

In the case where the photodiode array is operated in the Geiger mode, a recovery time (voltage recovery time) τ in the case where photons are made incident to the one light detecting sections 10 depends on a product (RC constant=Cj×Rq) of a junction capacitance (pixel capacity) Cj stipulated by an area of the light detection region in the light detecting sections 10 and a depletion layer width expanding from the p-n junction, and a resistance value of the resistive part 4 (quenching resistance value Rq).

When the pixel size (the area of the light detecting sections) is made smaller, the junction capacitance Cj becomes smaller. Therefore, in order to obtain the same recovery time τ, i.e., the same RC constant, it is necessary to increase the quenching resistance value Rq. The quenching resistance value Rq may be determined by adjusting the resistivity, the thickness, the width, and the length. Because the resistivity, the width, and the thickness are restricted by process conditions, it is rational that the resistance value Rq is adjusted by changing the length. In order to obtain the same recovery time τ, the larger the pixel size is, the resistive layer 4B is set to be shorter, and the smaller the pixel size is, the resistive layer 4B is set to be longer.

In the case where the RC constant is too small, quenching after occurrence of avalanche multiplication is made insufficient, and a phenomenon called latching current is caused, that does not indicate a normal operation. On the other hand, in the case where the RC constant is too large, the recovery time (voltage recovery time) gets longer. Accordingly, a value of the RC constant is set to an optimum value (2 to 20 nm) according to a device.

In addition, the gain depends on the junction capacitance Cj and an applied voltage, and in the structure of the embodiment, the gain is decreased by reducing the junction capacitance Cj. As a noise component of the photodiode array, in addition to a dark pulse, an after pulse, and a pseudo-output signal by an optical crosstalk as well are included. An after pulse means a pulse which is generated such that some of the electrons/holes generated by avalanche multiplication are trapped by an impurity level or the like, and are thereafter released at a certain time interval, thereby causing avalanche multiplication again. An optical crosstalk is caused by a pulse which is generated such that photons generated with a low probability during avalanche multiplication enter into an adjacent pixel to be absorbed therein, to generate pairs of electrons/holes, thereby causing avalanche multiplication. The both are noise components by which the output for one photon is not one pulse, but a plurality of pulses.

As in the structure of the embodiment, when the junction capacitance Cj, i.e., the gain is little, the total number of pairs of electrons/holes generated by avalanche multiplication is made smaller, the probability of generation of pulses by an after pulse and an optical crosstalk is lowered, which makes it possible to obtain an effect of noise reduction.

Because the large junction capacitance Cj and the higher gain the element has, the longer the time of sweeping out the generated carriers is, the voltage recovery time gets longer. The lower the gain is, the recovery time gets shorter. As in the embodiment, when the pixel pitch is made smaller, the voltage recovery time gets shorter, which makes it possible to improve the photon counting rate.

What is claimed is:

1. A photodiode array comprising:
a plurality of avalanche photodiodes operated in Geiger mode,
a plurality of quenching resistors,
wherein
each of the quenching resistors is connected to each of the avalanche photodiodes so as to cause a voltage drop in the quenching resistor when an avalanche effect occurs in the avalanche photodiode;
each of the quenching resistors comprises a resistive layer being provided on a light incident side of a semiconductor substrate; and
the resistive layer comprises SiCr; and
a wiring pattern for signal readout connected to the resistive layer.

2. The photodiode array according to claim 1, wherein a thickness of the resistive layer is 3 nm or more and 50 nm or less.

3. The photodiode array according to claim 1, wherein
the resistive layer has transmittance of 80% or more with respect to light with a wavelength ranging from 400 nm to 1200 nm, and
the semiconductor substrate forming the avalanche photodiodes comprises Si.

4. The photodiode array according to claim 1, comprising a plurality of light detecting sections including the avalanche photodiodes respectively, wherein an interval X between centers of the adjacent light detecting sections is 20 µm or less.

* * * * *